(12) United States Patent
Kawanaka et al.

(10) Patent No.: US 10,114,056 B2
(45) Date of Patent: Oct. 30, 2018

(54) DETERIORATION SPECIFYING DEVICE AND DETERIORATION SPECIFYING METHOD

(71) Applicants: FUJITSU TEN LIMITED, Kobe-shi, Hyogo (JP); TOYOTA JIDOSHA KABUSHIKI KAISHA, Toyota-shi, Aichi-ken (JP)

(72) Inventors: Shota Kawanaka, Kobe (JP); Sho Tamura, Kobe (JP); Takahiro Okada, Kobe (JP); Hiromasa Tanaka, Okazaki (JP); Mitsuyori Matsumura, Seto (JP)

(73) Assignees: FUJITSU TEN LIMITED, Kobe (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/433,404

(22) Filed: Feb. 15, 2017

(65) Prior Publication Data

US 2017/0276714 A1 Sep. 28, 2017

(30) Foreign Application Priority Data

Mar. 25, 2016 (JP) .................... 2016-062527

(51) Int. Cl.
| | |
|---|---|
| *G01R 31/00* | (2006.01) |
| *G01R 31/12* | (2006.01) |
| *G01R 31/28* | (2006.01) |
| *G01R 31/40* | (2014.01) |

(52) U.S. Cl.
CPC ....... *G01R 31/007* (2013.01); *G01R 31/1272* (2013.01); *G01R 31/28* (2013.01); *G01R 31/006* (2013.01); *G01R 31/40* (2013.01)

(58) Field of Classification Search
CPC .... G01R 31/00; G01R 31/005; G01R 31/006; G01R 31/007; G01R 31/1272; G01R 31/317; G01R 31/31721; G01R 31/28; G01R 31/40; G01R 31/42
USPC .............. 324/500, 503, 512, 522, 525, 537, 324/764.01, 551, 555, 600, 649, 691, 713
See application file for complete search history.

(56) References Cited

U.S. PATENT DOCUMENTS 5,818,236 A * 10/1998 Sone ..................... B60L 3/0023
324/509
7,075,311 B1 * 7/2006 Oshiro ............... G01R 31/1272
324/557
(Continued)

FOREIGN PATENT DOCUMENTS

| | | |
|---|---|---|
| JP | 2005-192324 A | 7/2005 |
| JP | 2008-167617 A | 7/2008 |

(Continued)

*Primary Examiner* — Hoai-an D. Nguyen
(74) *Attorney, Agent, or Firm* — Oliff PLC

(57) ABSTRACT

A power-supply monitoring device includes a capacitor that is connected to an insulated electric power source to execute charging/discharging. A power-supply monitoring device including this capacitor forms a charging path for detecting deterioration in an insulation resistance of an electric power source, and detects a voltage of the capacitor when being charged through this charging path. A vehicle controller specifies an abnormal part based on whether or not the voltage of the capacitor detected by the power-supply monitoring device is within a predetermined range.

5 Claims, 12 Drawing Sheets

(56) References Cited

U.S. PATENT DOCUMENTS

| | | | | |
|---|---|---|---|---|
| 8,373,424 B2 * | 2/2013 | Kawamura | ........... | G01R 31/028 |
| | | | | 324/503 |
| 9,817,056 B2 * | 11/2017 | Kawamura | ............ | G01R 31/14 |
| 2008/0094022 A1 * | 4/2008 | Horikoshi | ............ | G01R 31/343 |
| | | | | 318/802 |
| 2008/0197855 A1 * | 8/2008 | Uchida | ................ | G01R 27/025 |
| | | | | 324/509 |
| 2011/0006781 A1 * | 1/2011 | Kawamura | .......... | G01R 31/025 |
| | | | | 324/551 |
| 2013/0342215 A1 | 12/2013 | Kawamura | | |
| 2015/0293167 A1 * | 10/2015 | Kawamura | ............ | G01R 31/14 |
| | | | | 324/551 |
| 2016/0252559 A1 * | 9/2016 | Tamura | ................ | G01R 31/028 |
| | | | | 324/548 |
| 2016/0252587 A1 * | 9/2016 | Kawanaka | ......... | G01R 31/3627 |
| | | | | 324/549 |
| 2016/0377670 A1 | 12/2016 | Tamida et al. | | |
| 2017/0160334 A1 * | 6/2017 | Kawanaka | .......... | B60L 11/1809 |
| 2017/0225572 A1 * | 8/2017 | Kawanaka | .......... | B60L 3/0069 |

FOREIGN PATENT DOCUMENTS

| | | |
|---|---|---|
| JP | 2012-189378 A | 10/2012 |
| JP | 2012-202723 A | 10/2012 |
| JP | 2013-236486 A | 11/2013 |
| JP | 2017-138278 A | 8/2017 |
| WO | 2015/075821 A1 | 5/2015 |

\* cited by examiner

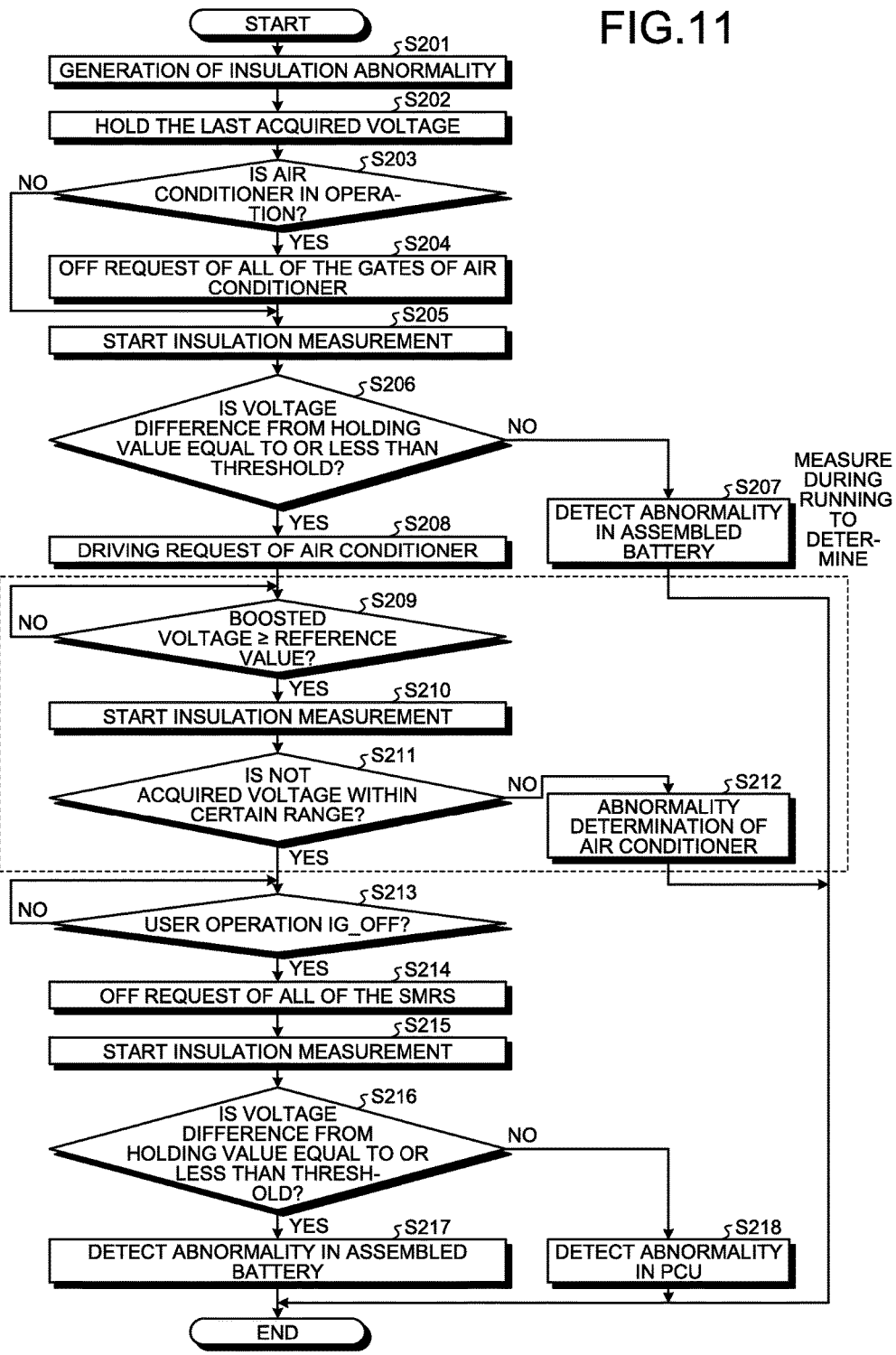

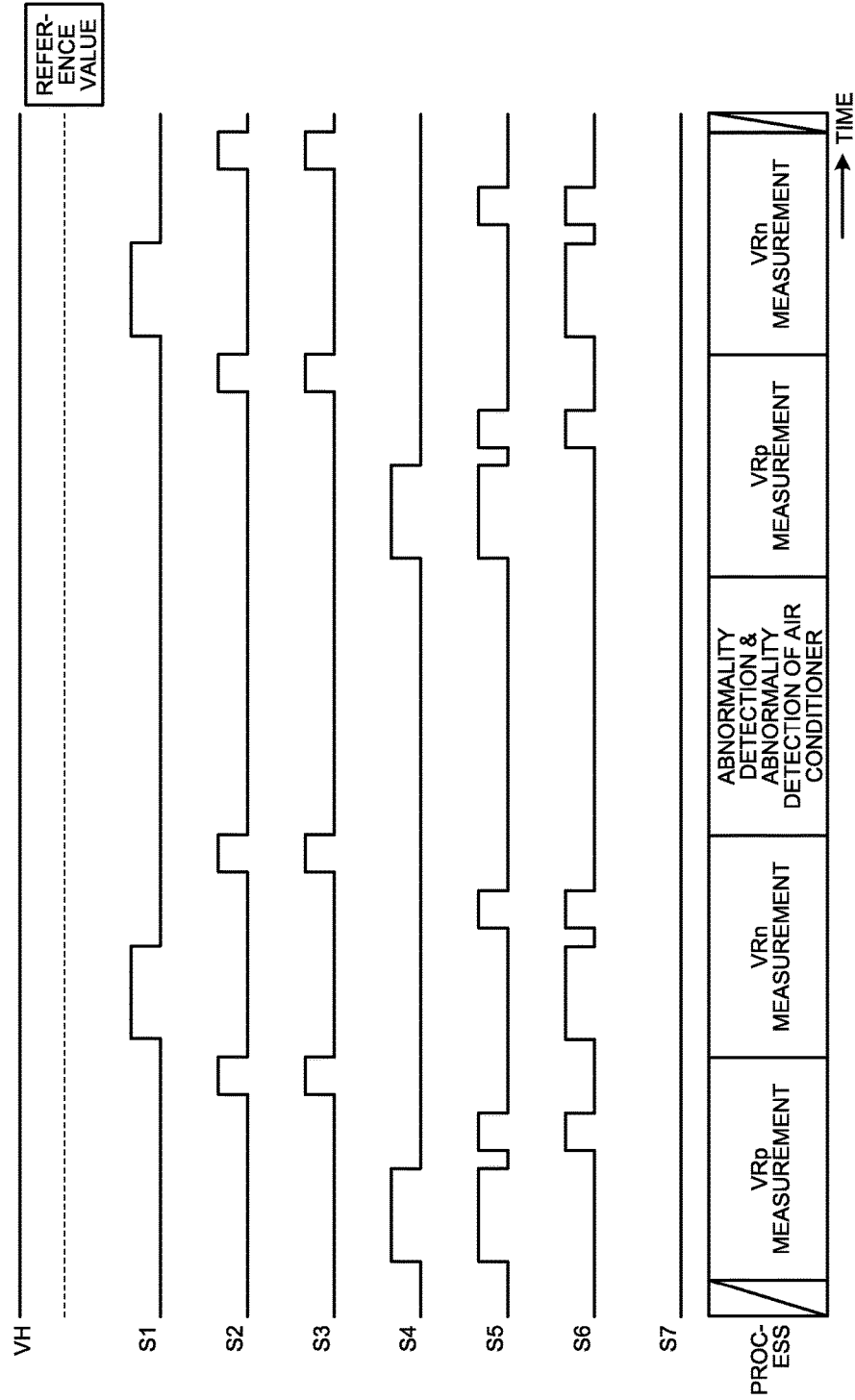

DETERIORATION SPECIFYING DEVICE AND DETERIORATION SPECIFYING METHOD

CROSS-REFERENCE TO RELATED APPLICATION

This application is based upon and claims the benefit of priority of the prior Japanese Patent Application No. 2016-062527, filed on Mar. 25, 2016 the entire contents of which are incorporated herein by reference.

FIELD

The embodiment discussed herein is directed to a deterioration specifying device and a deterioration specifying method.

BACKGROUND

Conventionally, a vehicle, such as a hybrid vehicle and an electric vehicle, includes an electric power source that supplies power to a motor as a driving source. Because the aforementioned electric power source is configured to be insulated from a vehicle body, the vehicle is equipped with a monitoring device mounted thereon, which monitors an insulation state of the electric power source, in other words, which detects the deterioration of insulation resistance of the electric power source.

As such a monitoring device, there is known a monitoring device that employs a pulse application system that determines a deteriorated part of the insulation resistance by using application of a pulse. Specifically, when the ignition of a vehicle is turned off, the monitoring device generates a pulse by using a microcomputer and the like, and applies the pulse to a negative electrode (total minus) of a battery. When the pulse is applied in this manner, an electric current flows through an insulation resistance and a GrouND (GND) of the vehicle body. Because the peak value of the pulse is reduced when the insulation resistance is reduced, the monitoring device can detect an abnormality. The monitoring device switches between actuators by using switches that connect or disconnect the actuators to determine a deteriorated part of the insulation resistance.

Patent Literature 1: Japanese Laid-open Patent Publication No. 2012-202723
Patent Literature 2: Japanese Laid-open Patent Publication No. 2008-167617
Patent Literature 3: Japanese Laid-open Patent Publication No. 2013-236486

However, the aforementioned technology does not have sufficient efficiency because the abnormal part is specified after the ignition of the vehicle is stopped.

For example, the ignition of the vehicle may be started immediately after the ignition is stopped depending on situations. In this case, it is impossible to specify a deteriorated part of the insulation resistance. Even when an abnormality in an insulation state of an electric power source is detected during running of the vehicle, it is impossible to specify the deteriorated part of the insulation resistance until the vehicle is stopped. This leads to a mismatch between a situation of the abnormality detection and a situation of details determination. Thus, it is impossible to specify a cause of the deterioration, and the recurrence probability thereof becomes high.

SUMMARY

A power-supply monitoring device includes a capacitor that is connected to an insulated electric power source to execute charging/discharging. A power-supply monitoring device including this capacitor forms a charging path for detecting deterioration in an insulation resistance of an electric power source, and detects a voltage of the capacitor when being charged through this charging path. A vehicle controller specifies an abnormal part based on whether or not the voltage of the capacitor detected by the power-supply monitoring device is within a predetermined range.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 11 is a flowchart illustrating a part of a processing procedure of an abnormal part specifying process; and FIG. 12 is a time chart of the deterioration detecting process and the abnormal part specifying process.

DESCRIPTION OF EMBODIMENT

Hereinafter, an embodiment of a deterioration specifying device and a deterioration specifying method will be described in detail with reference to the accompanying drawings. Moreover, the present invention is not limited to the embodiment described below.

1. Configuration of Charging/Discharging System

Figure 1:
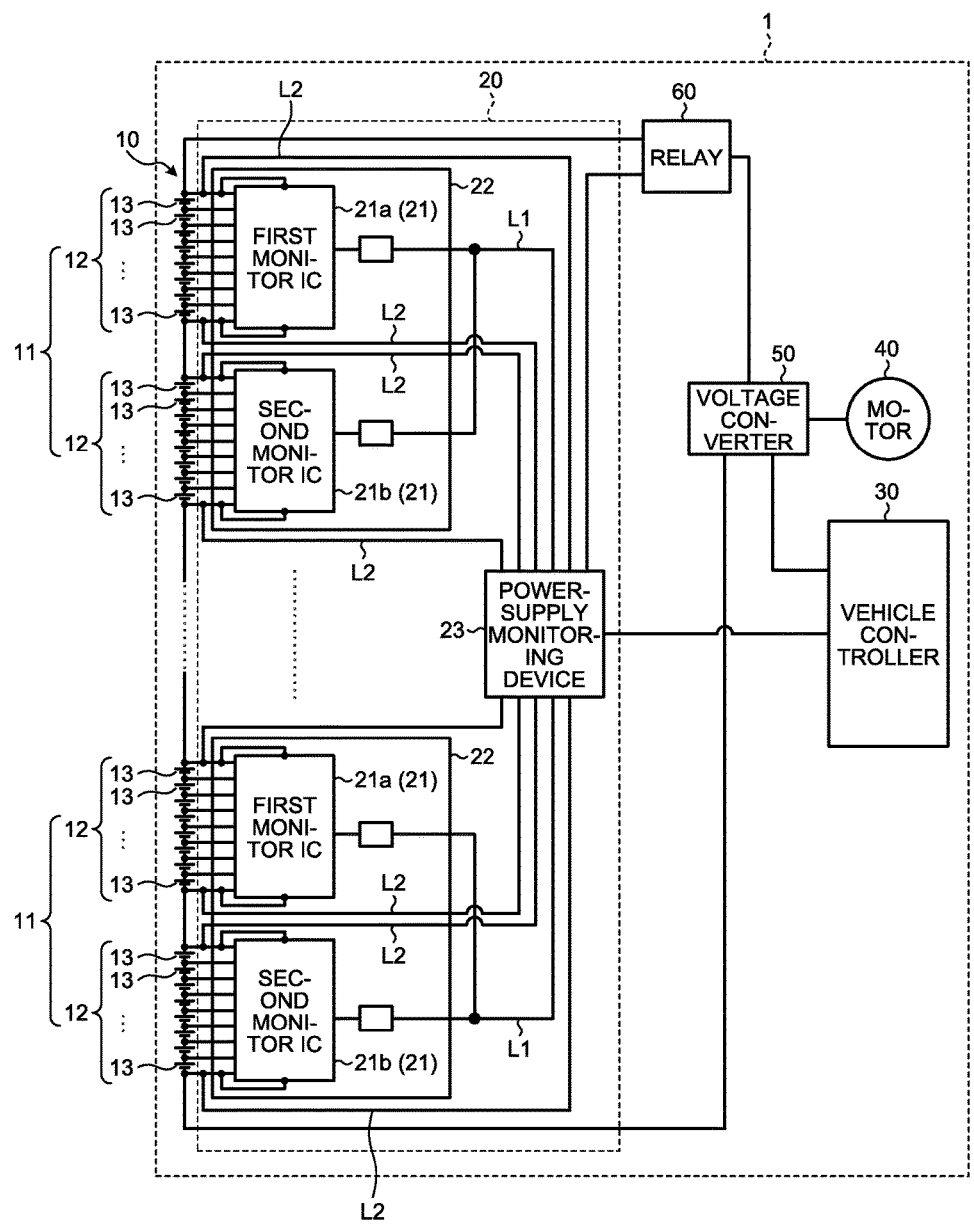
FIG. 1 is a block diagram illustrating a configuration example of a charging/discharging system including a power-supply monitoring device according to an embodiment.

FIG. 1 is a block diagram illustrating a configuration example of a charging/discharging system including a power-supply monitoring device according to an embodiment. A charging/discharging system 1 is mounted on a vehicle, such as a Hybrid Electric Vehicle (HEV), an Electric Vehicle (EV), a Fuel Cell Vehicle (FCV), which is not illustrated. The charging/discharging system 1 is a system that executes, on a motor as a driving source of the vehicle, charging/discharging of an electric power source that supplies power, etc.

Specifically, the charging/discharging system 1 includes an assembled battery 10, a power-supply monitoring system 20, a vehicle controller 30, a motor 40, a voltage converter 50, and a fail-safe relay 60. The power-supply monitoring system 20 includes a plurality of satellite boards 22 including monitor ICs (Integrated Circuits) 21, etc., and a power-supply monitoring device 23.

The assembled battery 10 is an electric power source (battery) that is insulated from a vehicle body (not illustrated) to be constituted of a plurality of blocks 11. Each of the blocks 11 includes a plurality of (for example, two) battery stacks 12 that are serially connected. Each of the battery stacks 12 includes a plurality of battery cells 13 that are, for example, serially connected.

The numbers of, the blocks 11, the battery stacks 12, and the battery cells 13 are not limited to the aforementioned or illustrated. For example, a lithium-ion secondary battery, a nickel-hydrogen secondary battery, etc. may be used as the aforementioned assembled batteries 10, however, is not limited thereto.

Each of the battery cells 13 is electrically connected to the monitor IC 21 provided on the satellite board 22. The voltage of each of the battery cells 13 is detected by the monitor IC 21. The number of the monitor ICs 21 is two or more including a first monitor IC 21a and a second monitor IC 21b, and each of the first monitor IC 21a and the second monitor IC 21b detects the voltage of the battery cell 13 corresponding to the one battery stack 12.

The power-supply monitoring device 23 measures, through a conductor L2, the voltage value charged in a capacitor (to be mentioned later) to detect deterioration in insulation resistance (to be mentioned later) included in the power-supply monitoring system 20, this will be explained later. For example, the deterioration in insulation resistance includes generation of electric leak of the assembled battery 10 caused by reduction in the resistance value of the insulation resistance. The power-supply monitoring device 23 can transmit voltage detecting requests so as to cause the respective monitor ICs 21 to detect the voltages of the plurality of battery cells 13, and further receive the detected results through communication lines L1. Thus, the power-supply monitoring device 23 can also monitor the voltages of the battery cells 13.

It is preferable that the power-supply monitoring device 23 also has a function of determining whether or not the monitor ICs 21 normally operate. Specifically, for example, the power-supply monitoring device 23 compares the stack voltage directly detected with the stack voltage acquired from sum of the voltage of the battery cells 13 received from the monitor IC 21, and thus, when the difference between the stack voltages is larger than a tolerance, determines the monitor IC 21 to be abnormal. When the monitor IC 21 is determined to be abnormal, for example, the power-supply monitoring device 23 may disconnect the fail-safe relay 60 not to execute charging/discharging on the battery cell 13.

The vehicle controller 30 executes charging/discharging on the assembled battery 10 in accordance with a charge state of the assembled battery 10 to control the vehicle. Specifically, the vehicle controller 30 converts, by using the voltage converter 50, the voltage charged in the assembled battery 10 from the voltage of direct current (DC) into that of alternate current (AC), and supplies the converted voltage to the motor 40 so as to drive the motor 40. Thus, the assembled battery 10 is to be discharged.

The vehicle controller 30 causes the voltage converter 50 to convert the voltage generated by regenerative braking of the motor 40 from the voltage of AC into that of DC so as to supply to the assembled battery 10. Thus, the assembled battery 10 is charged. Thus, the vehicle controller 30 monitors the voltage of the assembled battery 10 on the basis of a charge state of the assembled battery 10 acquired from the power-supply monitoring device 23, and executes control in accordance with the monitored result.

The vehicle controller 30 specifies an abnormal part on the basis of whether or not the voltage of the capacitor acquired by the power-supply monitoring device 23 is within a predetermined range. Details thereof will be mentioned later, for example, when the voltage of the capacitor is within the range of a predetermined negative voltage value, the vehicle controller 30 specifies, as an abnormal part, the motor 40 that receives supply of electricity from the assembled battery 10 so as to be driven.

2. Configuration of Connection Part

Figure 2:
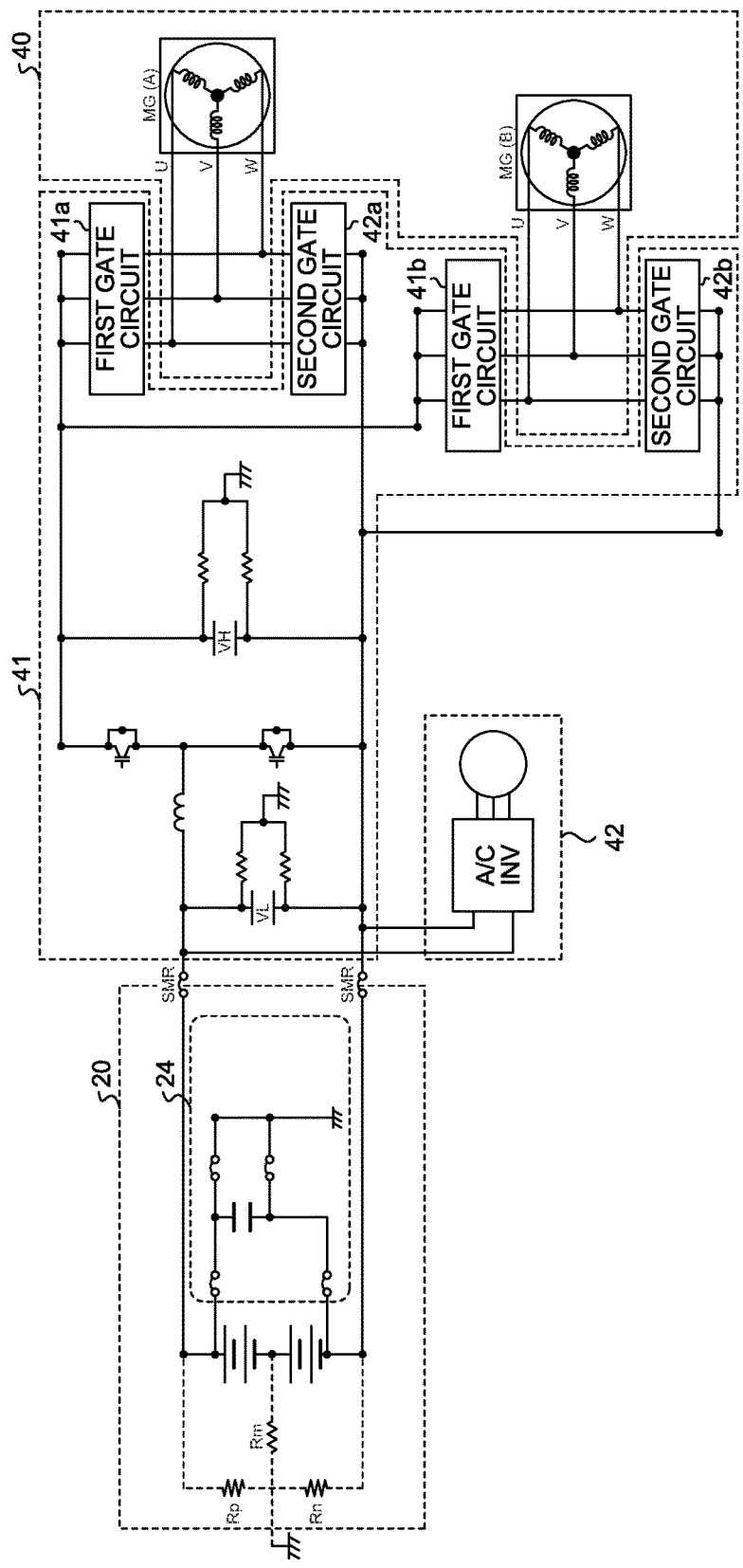
FIG. 2 is a diagram illustrating a vehicle system.

Next, a part to be specified as abnormal when the vehicle controller 30 detects an insulation abnormality will be explained. A detailed connection configuration of a vehicle system including the power-supply monitoring system 20, the relay 60, the voltage converter 50, and the motor 40 illustrated in FIG. 1 will be explained. FIG. 2 is a diagram illustrating the vehicle system.

As illustrated in FIG. 2, the vehicle system includes the power-supply monitoring system 20, a Power Control Unit (PCU) 41, an air conditioning part 42, and the motor 40. The power-supply monitoring system 20; and the PCU 41, the air conditioning part 42, and the motor 40 are connected via a System Main Relay (SMR).

The PCU 41 includes a boost converter that is a type of DC-DC converting circuits (DC-DC converters), and is a circuit for acquiring an output of the higher voltage than the input voltage. The air conditioning part 42 includes an internal inverter, and controls connection to the power-supply monitoring system 20 by using the inverter. The motor 40 includes a first gate circuit 41a and a second gate circuit 42a that MG (A), which is a motor, is connected thereto; and a first gate circuit 41b and a second gate circuit 42b that MG (B), which is a motor, is connected thereto. The gate driving of this inverter is; (first gate circuits 41a and 41b are ON):(second gate circuits 42a and 42b are ON)=50: 50.

3. Configuration of Power-Supply Monitoring Device

Figure 3:
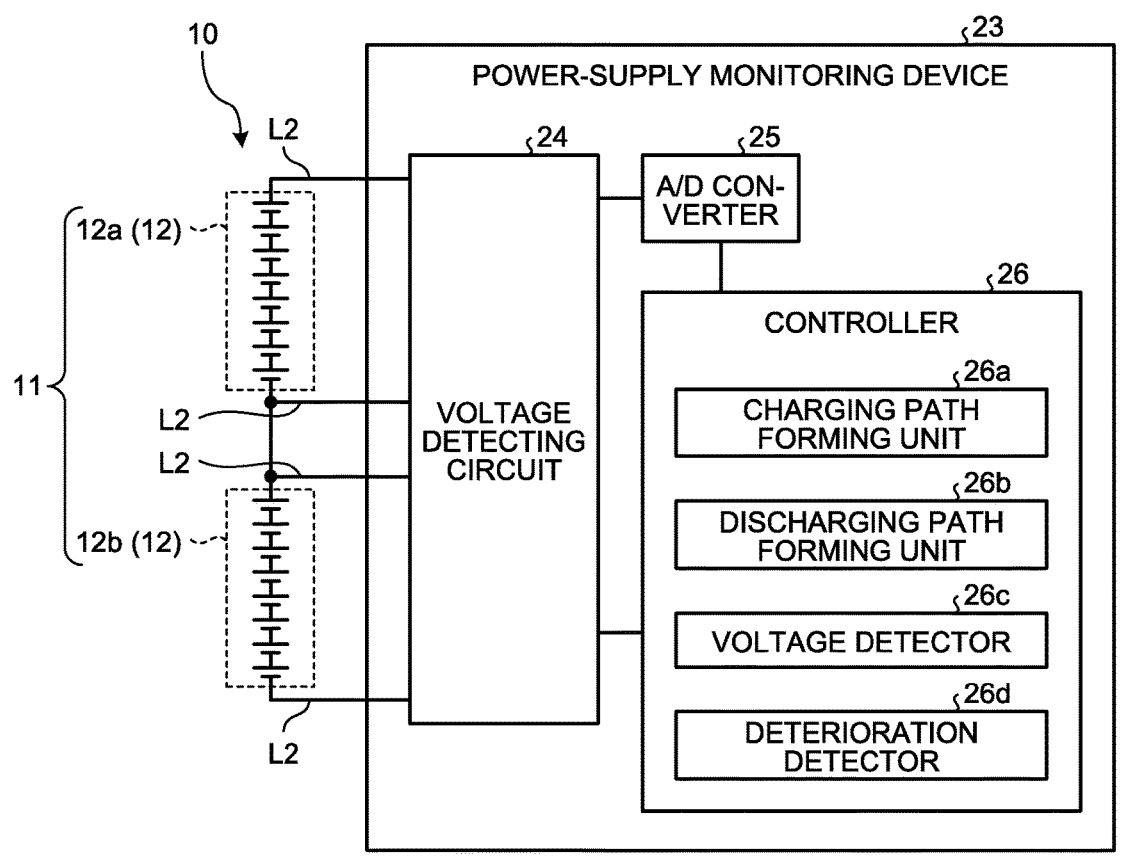
FIG. 3 is a block diagram illustrating a configuration example of the power-supply monitoring device.

Next, a configuration of the power-supply monitoring device 23 will be explained. FIG. 3 is a block diagram illustrating a configuration example of the power-supply monitoring device 23. In FIG. 3, the satellite boards 22, the communication lines L1, etc. are omitted. In FIG. 3, for the convenience of understanding, one of the plurality of blocks 11 is illustrated, and hereinafter, one of the two battery stacks 12 in the block 11 may be referred to as "first stack 12a", and the other may be referred to as "second stack 12b".

The power-supply monitoring device 23 is, for example, an Electronic Control Unit (ECU), and, as illustrated in FIG. 3, includes a voltage detecting circuit 24, an A/D converter 25, and a controller 26. The voltage detecting circuit 24 includes circuits for executing detection of each stack voltage, detection of deterioration in the insulation resistance, etc.

Therefore, the power-supply monitoring device 23 according to the present embodiment is configured to execute detection of deterioration in the insulation resistance while simplifying the configuration thereof to suppress the increase in the cost so as to be able to specify a deterioration part of insulation even during running of the vehicle. Hereinafter, details of the configuration of the power-supply monitoring device 23 will be explained more specifically.

Figure 4:
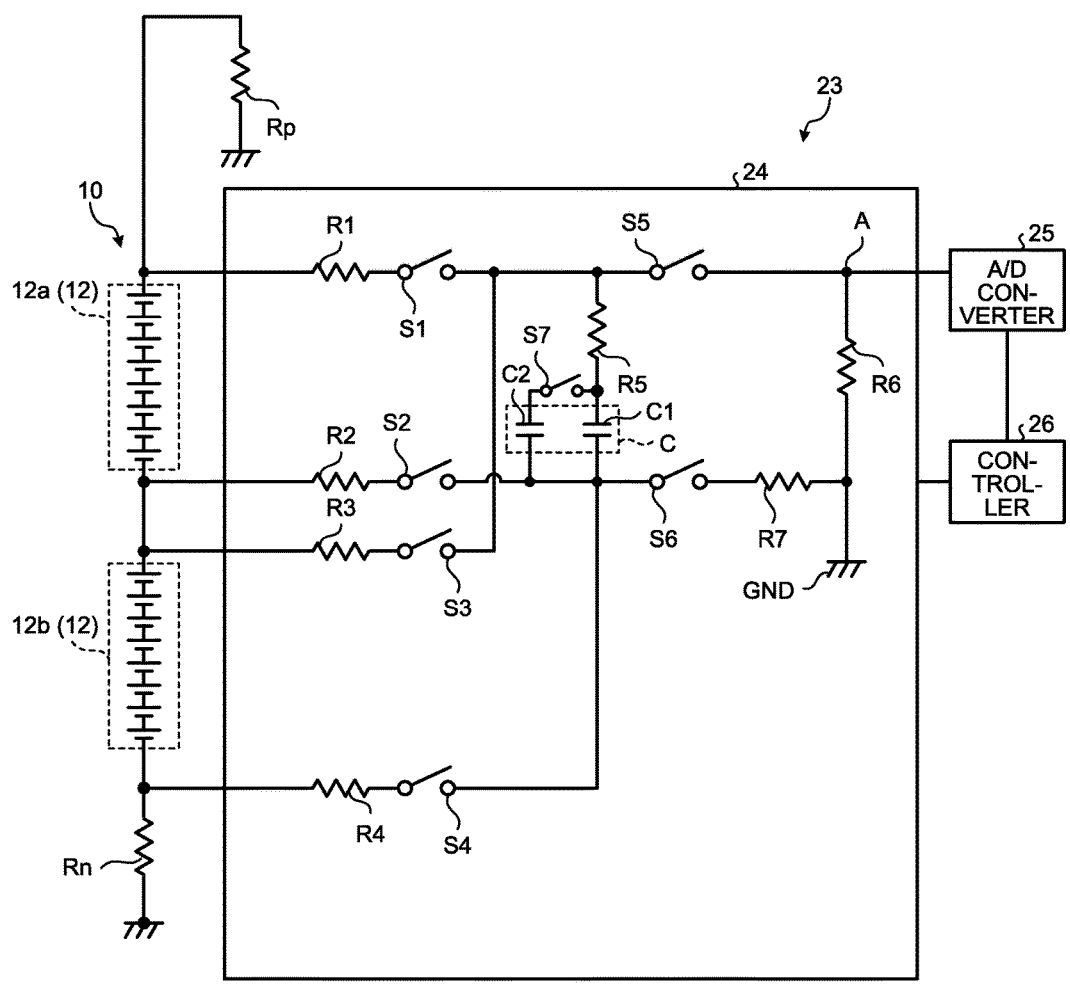
FIG. 4 is a diagram illustrating a configuration example of a voltage detecting circuit.

FIG. 4 is a diagram illustrating a configuration example of the voltage detecting circuit 24 of the power-supply monitoring device 23. As illustrated in FIG. 4, the voltage detecting circuit 24 includes a first capacitor C1, a second capacitor C2, first to sixth switches S1 to S6, a changeover switch S7, and first to seventh resistances R1 to R7. The assembled battery 10 includes an insulation resistance Rp on a positive electrode side and an insulation resistance Rn on a negative electrode side. In the present embodiment, the example that includes two capacitors will be explained, however, not limited thereto, may include one capacitor.

This voltage detecting circuit 24 employs a flying capacitor system, as to be mentioned later, and charges the first capacitor C1 by using the voltage of each of the stacks 12a and 12b, and then detects the voltage of the first capacitor C1 as the voltage of the corresponding stack 12a or 12b. The voltage detecting circuit 24 may detect, not limited to the voltage of a stack, the voltage of a block that is a congregation of a plurality of cells.

Specifically, the voltage detecting circuit 24 is divided into a charge-side circuit and a discharge-side circuit through the first and second capacitors C1 and C2. Hereinafter, the first and second capacitors C1 and C2 may be collectively referred to as a "capacitor C".

The charge-side circuit is a part that each of the stacks 12a and 12b of the assembled battery 10 is connected to the capacitor C therein, and includes a path that the voltage of each of the stacks 12a and 12b is charged on the capacitor C therethrough. The discharge-side circuit is a part including a path that the voltage having charged in the capacitor C is discharged therethrough.

ON/OFF of each of the switches S1 to S7 is controlled to control charge and discharge on the capacitor C. For example, a Solid State Relay (SSR) may be used as the aforementioned each of the switches S1 to S7, however, is not limited thereto. The first to seventh resistances R1 to R7 are resistances for voltage detection that detects the voltage of the capacitor C.

In the charge-side circuit of the voltage detecting circuit 24, each of the first stack 12a and the second stack 12b is parallel connected to the capacitor C. In other words, both ends of the capacitor C are connected to respective positive and negative electrodes of the first stack 12a, and further connected to respective positive and negative electrodes of the second stack 12b.

The first resistance R1, the first switch S1, and the fifth resistance R5 are serially arranged between the positive electrode side of the first stack 12a and the capacitor C, and the second resistance R2 and the second switch S2 are serially arranged between the negative electrode side of the first stack 12a and the capacitor C.

The third resistance R3, the third switch S3, and the fifth resistance R5 are serially arranged between the positive electrode side of the second stack 12b and the capacitor C, and the fourth resistance R4 and the fourth switch S4 are serially arranged between the negative electrode side of the second stack 12b and the capacitor C.

In the discharge-side circuit of the voltage detecting circuit 24, the fifth switch S5 is arranged on paths on the positive electrode sides of the first stack 12a and the second stack 12b, and the fifth resistance R5 is arranged between one end of the fifth switch S5 and the capacitor C. The sixth switch S6 is arranged on paths on the negative electrode sides of the first and second stacks 12a and 12b, and one end of the sixth switch S6 is connected to the capacitor C.

The other end of the fifth switch S5 is connected to the A/D converter 25, and is branched on the way to be connected to a vehicle body GND through the sixth resistance R6. The other end of the sixth switch S6 is connected to the vehicle body GND through the seventh resistance R7. The vehicle body GND is one example of a ground point.

The A/D converter 25 converts, into a digital value, an analog value indicating the voltage at a connection point A of the voltage detecting circuit 24, and outputs the converted digital value to the controller 26.

Next, details of the first and second capacitors C1 and C2 will be explained. Because it is desirable that processes of voltage detection of the aforementioned stacks 12a and 12b are completed in a comparatively short time, it is preferable that the electrostatic capacity of a capacitor used for voltage detection is comparatively small so as to be charged in a short time.

On the other hand, it is preferable that the electrostatic capacity of a capacitor used for deterioration detection of the insulation resistances Rp and Rn is comparatively large. In other words, there exists floating capacitance in a vehicle, which is not intended at the time of design. When receiving the influence of this floating capacitance during the deterioration detection of the insulation resistances Rp and Rn, there exists a fear that the voltage of the capacitor is detected inaccurately, and thus the accuracy of the deterioration detection reduces in some cases. Therefore, it is preferable that the electrostatic capacity of a capacitor used for the deterioration detection of the insulation resistances Rp and Rn is comparatively enlarged to reduce the influence of the floating capacitance on whole of the capacity.

Therefore, in the present embodiment, the first and second capacitors C1 and C2 are configured as follows. Specifically, the first capacitor C1 is serially connected to the fifth resistance R5. The second capacitor C2 is serially connected to the changeover switch S7.

The second capacitor C2 and the changeover switch S7 are parallel connected to the first capacitor C1. Therefore, ON/OFF of the changeover switch S7 is controlled to be able to easily switch a capacitor to be connected in the charge-side circuit and the discharge-side circuit, and thus whole of the electrostatic capacity of each circuit can be variable.

Specifically, for example, when the changeover switch S7 is turned OFF during a process of voltage detection of each of the stacks 12a and 12b, because only the first capacitor C1 is connected in the charge-side and discharge-side circuits, the process is to be executed by using comparatively small electrostatic capacity.

On the other hand, when the changeover switch S7 is turned ON during a process of deterioration detection of the insulation resistances Rp and Rn, because the first and second capacitors C1 and C2 are connected in the charge-side and discharge-side circuits, the process is to be executed by using comparatively large electrostatic capacity. The process can be executed with the changeover switch S7 turned OFF during the process of deterioration detection of the insulation resistances Rp and Rn to form the charge-side and discharge-side circuits using only the first capacitor C1.

Herein, the value of the electrostatic capacity of the second capacitor C2 is assumed to be larger than that of the floating capacitance. For example, the electrostatic capacity of the second capacitor C2 is several tens of times of the floating capacitance of the vehicle.

Thus, the electrostatic capacity of the capacitor to be used in the deterioration detection of the insulation resistances Rp and Rn, in other words, the combined capacity of the first and second capacitors C1 and C2 can be more enlarged, and thus influence of the floating capacitance on whole of the capacity can be more reduced. Thus, the first capacitor C1 and the second capacitor C2 are used for the deterioration detection of the insulation resistances Rp and Rn.

As illustrated in FIG. 4, in the circuit of the voltage detecting circuit 24, the insulation resistance Rp on the positive electrode side and the insulation resistance Rn on the negative electrode side of the aforementioned assembled battery 10 are arranged. Each of the insulation resistances Rp and Rn indicates the combined resistance of an implemented resistance and a resistance virtually indicating the insulation from the vehicle body GND, herein, whether the mounted resistance or the virtual resistance does not matter.

A resistance value of each of the insulation resistances Rp and Rn is set to sufficiently large, for example, several MΩ, to the extent that the insulation resistance is hardly energized in a normal state. However, in a case of an abnormal state where the insulation resistance Rp or Rn deteriorates, for example, the assembled battery 10 short-circuits to the vehicle body GND and the like or the assembled battery 10 becomes nearly in a state of a short circuit, so that the resistance value thereof reduces to the extent that the insulation resistance is energized.

Herein, the charge and discharge of the first capacitor C (namely, first capacitor C1), which is executed to detect the deterioration of the insulation resistance Rp or Rn of the assembled battery 10, will be explained with reference to FIGS. 5 to 7.

Figure 5:
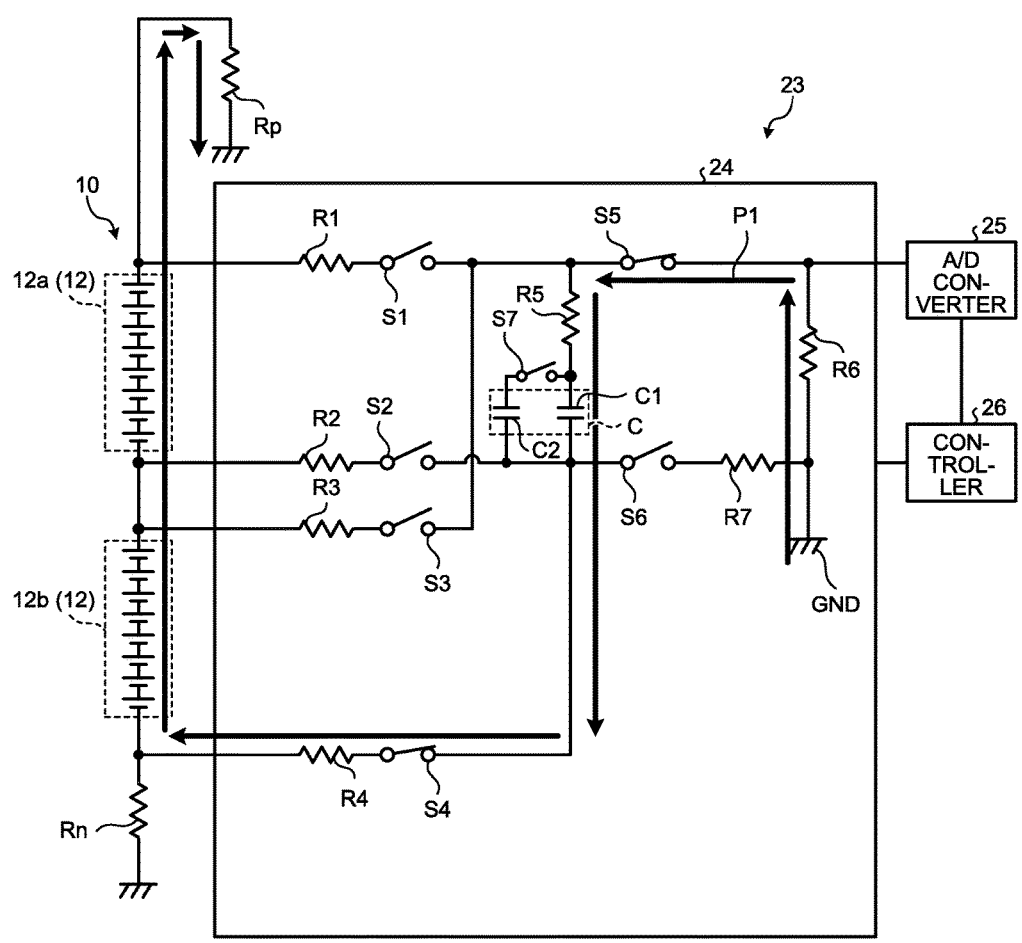
FIG. 5 is a diagram illustrating a charging path to be used in detection of deterioration in an insulation resistance Rp on a positive electrode side of an assembled battery.

FIG. 5 is a diagram illustrating a charging path to be used in detection of deterioration in the insulation resistance Rp on a positive electrode side of the assembled battery 10. FIG. 6 is a diagram illustrating a discharging path to be used in execution of discharge of the charged capacitor C. FIG. 7 is a diagram illustrating a charging path to be used in detection of deterioration in the insulation resistance Rn on a negative electrode side of the assembled battery 10.

First, when deterioration in the insulation resistance Rp on the positive electrode side is to be detected, as illustrated in FIG. 5, the fourth switch S4 and the fifth switch S5 are turned ON and the other switches S1 to S3, S6, and S7 are turned OFF. Thus, the positive electrode side of the first stack 12a is connected to the negative electrode side of the first stack 12a via the insulation resistance Rp, the sixth resistance R6, the fifth switch S5, the first capacitor C1, the fourth switch S4, the fourth resistance R4, and the second stack 12b.

In other words, a first path P1 is formed, which connects the first and second stacks 12a and 12b with the first capacitor C1 via the insulation resistance Rp on the positive electrode side. In this case, when the resistance value of the insulation resistance Rp is normal, the first path P1 is hardly energized, and when the insulation resistance Rp is deteriorated so that a resistance value thereof is reduced, the first path P1 is energized.

After a predetermined time elapsed from the formation of the first path P1, the voltage of the capacitor C is discharged. Specifically, as illustrated in FIG. 6, the fourth switch S4 is turned OFF and the sixth switch S6 is turned ON. Thus, in the voltage detecting circuit 24, a second path P2 as a discharging path is formed. The voltage of the first capacitor C1 detected in this case may be referred to as "voltage VRp", deterioration of the insulation resistance Rp is to be detect on the basis of the voltage VRp, and this will be mentioned later.

Figure 7:
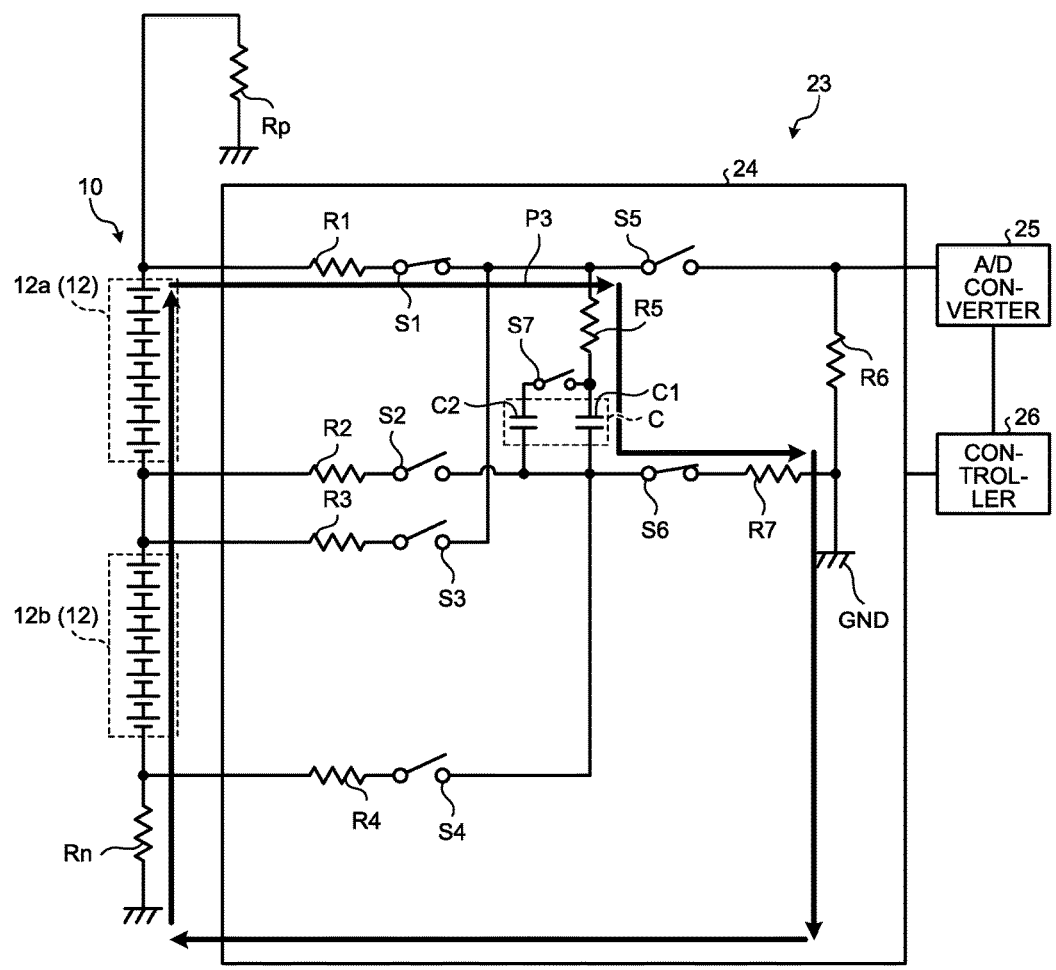
FIG. 7 is a diagram illustrating a charging path to be used in detection of deterioration in an insulation resistance Rn on a negative electrode side of the assembled battery.

In a case where deterioration of the insulation resistance Rn on the negative electrode side is detected, as illustrated in FIG. 7, the first switch S1 and the sixth switch S6 are turned ON, and the other switches S2 to S5, and S7 are turned OFF. Thus, the positive electrode side of the first stack 12a is connected to the negative electrode side of the first stack 12a via the first resistance R1, the first switch S1, the fifth resistance R5, the first capacitor C1, the sixth switch S6, the seventh resistance R7, the insulation resistance Rn, and the second stack 12b.

In other words, a third path P3 is formed, which connects the first and second stacks 12a and 12b to the first capacitor C1 via the insulation resistance Rn on the negative electrode side. In this case, when the resistance value of the insulation resistance Rn is normal, the third path P3 is hardly energized, and when the insulation resistance Rn is deteriorated so that a resistance value thereof is reduced, the third path P3 is energized.

Figure 6:
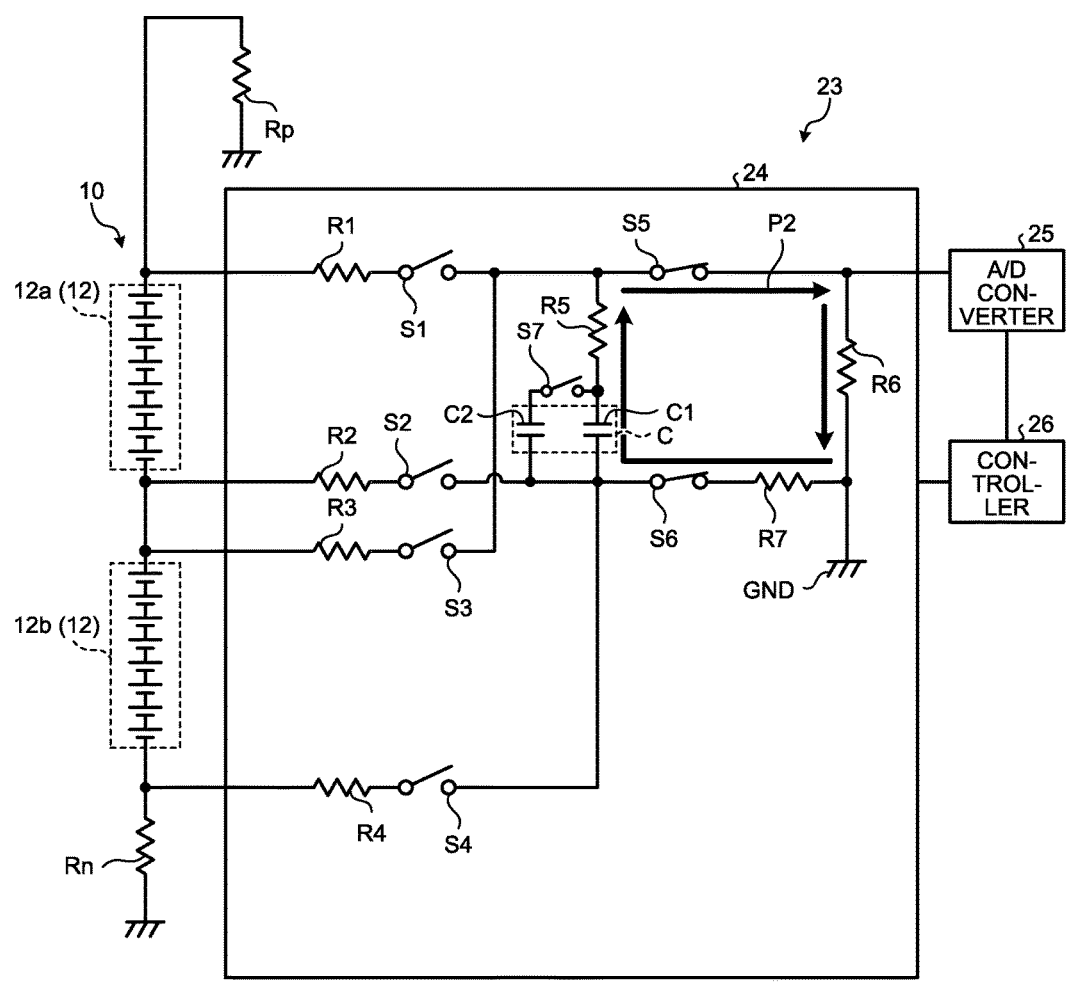
FIG. 6 is a diagram illustrating a discharging path to be used in execution of discharge of a charged capacitor.

After a predetermined time elapsed from the formation of the third path P3, as illustrated in FIG. 6, the voltage of the capacitor C is discharged. The voltage of the first capacitor C1 detected in this case is referred to as "voltage VRn", deterioration of the insulation resistance Rn is to be detected on the basis of the voltage VRn, and this will be mentioned later.

In deterioration detecting processes of the insulation resistances Rp and Rn, charge is executed for a predetermined time that is shorter than the time needed for a full charge, the deterioration detection of the insulation resistances Rp and Rn is executed by using the charged voltage as the respective voltages VRp and VRn.

Meanwhile, the aforementioned deterioration detection of the insulation resistances Rp and Rn is based on the assumption that the first switch S1 and the third switch S3 that are connected to the respective positive electrode sides of the electric power source stacks; and the second switch S2 and the fourth switch 4 that are connected to the respective negative electrode sides of the electric power source stacks normally operates. In other words, it is preferable that, before the processes of the aforementioned voltage detection and the aforementioned deterioration detection, states of the switches on the high voltage side are checked.

Returning to the explanation of FIG. 3, the controller 26 of the power-supply monitoring device 23 is a microcomputer including a Central Processing Unit (CPU), a Random Access Memory (RAM), a Read Only Memory (ROM), and the like, and controls whole of the power-supply monitoring device 23 including the voltage detecting circuit 24, the A/D converter 25, etc.

Specifically, the controller 26 includes a charging path forming unit 26a, a discharging path forming unit 26b, a voltage detector 26c, and a deterioration detector 26d. As explained in FIGS. 5 and 7, the charging path forming unit 26a controls the first switch S1 to the sixth switch S6 and the changeover switch S7 to form the first path P1 or the third path P3 that is a charging path. As explained in FIG. 6, the discharging path forming unit 26b controls the first switch S1 to the sixth switch S6 and the changeover switch S7 to form the second path P2 that is a discharging path.

The switching patterns of the first switch S1 to the sixth switch S6 and the changeover switch S7 are preliminary memorized in a memory such as the RAM or the ROM. The charging path forming unit 26a or the discharging path forming unit 26b reads out a switching pattern from the memory at an appropriate timing to form the charging path or the discharging path.

When the discharging path is formed by the discharging path forming unit 26b, the voltage detector 26c detects the voltage of the charged first capacitor C1 and the like by using the A/D converter 25. The voltage detector 26c is assumed to detect the aforementioned voltages VRp and VRn. The voltage detector 26c outputs the detected voltages VRp and VRn to the deterioration detector 26d and the vehicle controller 30.

The deterioration detector 26d detects the deterioration in the insulation resistance Rp and Rn on the basis of the voltage VRp and VRn of the first capacitor C1. Specifically, when the insulation resistance Rp or the insulation resistance Rn is not deteriorated and the resistance value thereof is not reduced, the first capacitor C1 is hardly charged, or, even when charged, substantially small voltage is charged. Therefore, the deterioration detector 26d compares the voltage VRp or the voltage VRn with a threshold Va that is preliminary set to a comparatively small value.

When the voltage VRp of the first capacitor C1 is equal to or more than the threshold Va, the deterioration detector 26d detects deterioration in the insulation resistance Rp, in other words, determines that an abnormality is generated in the insulation resistance Rp. On the other hand, when the voltage VRp is less than the threshold Va, the deterioration detector 26d determines that there exists no deterioration in the insulation resistance Rp, in other words, the insulation resistance Rp is normal.

Similarly, when the voltage VRn is equal to or more than the threshold Va, the deterioration detector 26d detects deterioration in the insulation resistance Rn. On the other hand, when the voltage VRn is less than the threshold Va, the deterioration detector 26d determines that there exists no deterioration in the insulation resistance Rn. In the aforementioned, the values of the voltages VRn and VRp are compared with the same value of the threshold Va, however not limited thereto, thresholds whose values are set to be different from each other may be used.

The deterioration detector 26d outputs, to the vehicle controller 30 and the like, information indicating the result of the deterioration state of the aforementioned insulation resistance Rp or Rn. The vehicle controller 30 executes specifying the abnormal part, vehicle control, a notification operation for a user, etc. in accordance with the deterioration state.

4. Specifying of Abnormal Part

Next, a process will be explained, in which, when the deterioration detector 26d detects a deterioration state of the insulation resistances Rp or Rn, the vehicle controller 30 specifies a deteriorated part (abnormal part).

The vehicle controller 30 instructs, during running of the vehicle, the power-supply monitoring device 23 to start the deterioration detection of the insulation resistance. The power-supply monitoring device 23 having received this instruction executes detection of the aforementioned voltage VRp and VRn, determines deterioration in the insulation resistances Rp and Rn, and notifies the vehicle controller 30 of the determination result and the measured voltages VRp and VRn.

When the power-supply monitoring device 23 detects an abnormality in the insulation resistance Rp or Rn during running of the vehicle, the vehicle controller 30 starts to specify an abnormal part before the vehicle is stopped.

For example, when an abnormality in the insulation resistance Rn is notified of from the power-supply monitoring device 23, the vehicle controller 30 holds the measured voltage VRn (Hereinafter, may be referred to as "holding voltage") that is previously measured. The vehicle controller 30 sequentially disconnects the connection of parts included in the vehicle system, and causes the power-supply monitoring device 23 to measure the VRn in the interrupted state. The vehicle controller 30 compares the holding voltage VRn just before the abnormality is detected with the VRn in a state where each of the parts is interrupted so as to specify the abnormal part.

On the other hand, the vehicle controller 30 causes the power-supply monitoring device 23 to measure the VRn to acquire the VRn measured by the insulation measurement after the abnormality detection. The vehicle controller 30 specifies the abnormal part by determining whether or not the acquired VRn is in within a predetermined range.

Herein, one example of specifying of an abnormal part after detection of an insulation abnormality will be explained. For example, the vehicle controller 30 executes turning OFF and the like on an inverter, etc. during running of the vehicle, and causes the power-supply monitoring device 23 to measure the VRn in a state where a gate of the air conditioning part 42 is turned OFF. When the deference between the holding voltage VRn and the VRn at the insulation measurement after detection of an insulation abnormality is equal to or more than a threshold, the vehicle controller 30 specifies the air conditioning part 42 as an abnormal part.

In other words, in a case where alteration of the voltage to be charged on the first capacitor C1 is small even when the air conditioning part 42 is disconnected, the relationship between the insulation abnormality and the air conditioning part 42 is considered to be low. Therefore, the vehicle controller 30 compares the holding voltage VRn at an insulation abnormality with the VRn at disconnection of the air conditioning part 42, and thus can determine whether or not there exists an abnormality in the air conditioning part 42.

Subsequently, when determining that there exists no abnormality in the air conditioning part 42, the vehicle controller 30 determines an abnormality in the motor 40 after the restart of the air conditioning part 42. For example, when the boosted voltage (VH) becomes equal to or more than a reference value after no existence of abnormality in the air conditioning part 42 is determined, the vehicle controller 30 causes the power-supply monitoring device 23 to execute measurement of an insulation abnormality so as to acquire the VRn. When the measured voltage VRn is within a predetermined range, the vehicle controller 30 specifies the motor 40 as the abnormal part.

Figure 8:
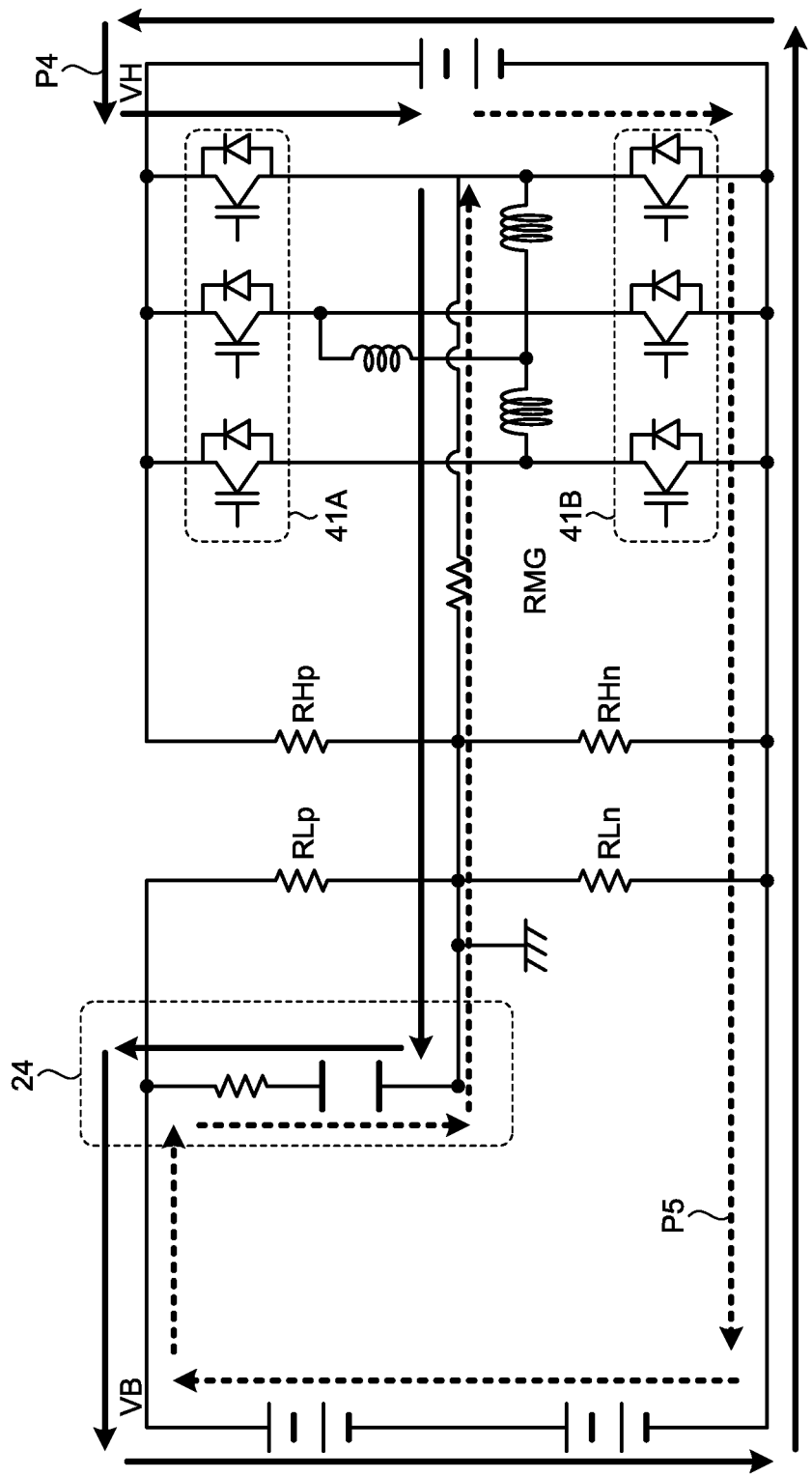
FIG. 8 is a diagram illustrating a motor.

Herein, the motor 40 will be explained. FIG. 8 is a diagram illustrating the motor 40. For the convenience of explanation, in FIG. 8, the vehicle system illustrated in FIG. 2 is simplified. Herein, the first gate circuits 41a and 41b are collectively referred to as a first gate circuit 41A, and the second gate circuits 42a and 42b are collectively referred to as a second gate circuit 41B. As illustrated in FIG. 8, the motor 40 includes electric current paths of the first gate circuit 41A and the second gate circuit 41B, and causes gates to drive in a predetermined ratio during running. In a case where the voltage (VH) of the motor 40 is in boosting and the motor 40 is normally driven, when the first gate circuit 41A of a ground fault phase of the motor 40 is turned ON, because a path similar to that in a case of a ground fault of the RHp is generated, when in a boosting state, the negative voltage is charged in the first capacitor C1 of the power-supply monitoring device 23. When the second gate circuit 41B is turned ON, a path similar to that in a case where ground faults of the RLn and RHn are generated, the positive voltage is charged on the first capacitor C1 of the power-supply monitoring device 23.

In other words, in a normal drive, a connection ratio between the first gate circuit 41A and the second gate circuit 41B is 50%, because negative charge (see "P4" in FIG. 8) caused by the boosted voltage during ON of the first gate circuit 41A is larger than positive charge (see "P5" in FIG. 8) during ON of the second gate circuit 41B, the negative voltage is charged on the first capacitor C1. The negative voltage to be charged in this time is smaller than that of a ground fault of the RHp. Therefore, when the negative voltage charged on the first capacitor C1 is within the preliminary set range of the negative voltage, the vehicle controller 30 can determine a ground fault of the motor 40.

Figure 9:
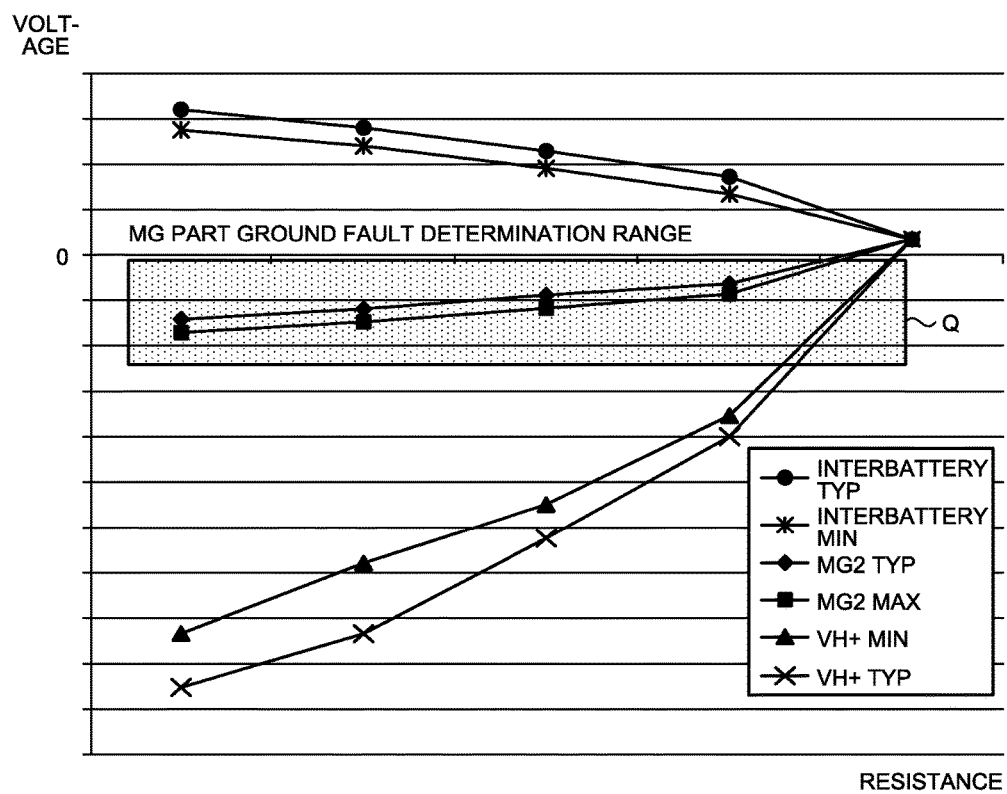
FIG. 9 is a diagram illustrating a threshold of a ground fault determination.

Herein, a threshold to be used for a ground fault determination of the motor 40 will be explained. FIG. 9 is a diagram illustrating a threshold of a ground fault determination. In the graph illustrated in FIG. 9, the vertical axis indicates the charged voltage, the horizontal axis indicates the resistance value of the motor 40, and the graph is preliminary obtained by researches, experiments, etc. As illustrated in FIG. 9, when the motor 40 is in a ground fault, the charged voltage of the capacitor becomes a value less than zero. The numeric values and the like are merely one example.

Therefore, when the voltage charged on the first capacitor C1 is within a range Q illustrated in FIG. 9, the vehicle controller 30 can determine a ground fault of the motor 40. Thus, the vehicle controller 30 compares the value of the voltage charged on the first capacitor C1 with the graph illustrated in FIG. 9 that is preliminary specified, so that it is possible to specify an abnormality in the motor 40 or an abnormal part in the motor 40.

Subsequently, when determining that there exists no abnormality in the motor 40, the vehicle controller 30 causes the process to wait until the ignition of the vehicle turns OFF. When the vehicle stops, the vehicle controller 30 turns OFF a system main relay to disconnect the power-supply monitoring system 20 from the PCU 41, and then causes the power-supply monitoring device 23 to execute measurement of an insulation abnormality so as to acquire the VRn.

When the difference between the holding voltage VRn and the VRn after the system main relay is turned OFF is larger than the threshold, the vehicle controller 30 specifies that an abnormal part is the PCU 41. On the other hand, the difference between the holding voltage VRn and the VRn after the system main relay is turned OFF is equal to or less than a threshold, the vehicle controller 30 specifies that an abnormal part is the voltage detecting circuit 24 of the power-supply monitoring device 23.

In other words, in a case where alteration of the voltage to be charged on the first capacitor C1 is small even when the PCU 41 is disconnected, the relationship between the insulation abnormality and the PCU 41 is considered to be low. In this case, the vehicle controller 30 specifies that the PCU 41 is in normal operation and an abnormal part is the voltage detecting circuit 24 of the power-supply monitoring device 23. Thus, the vehicle controller 30 compares, after the vehicle is stopped, the holding voltage VRn at an insulation abnormality with the VRn after the disconnection of the PCU 41 to be able to further narrow an abnormal part.

Figure 10:
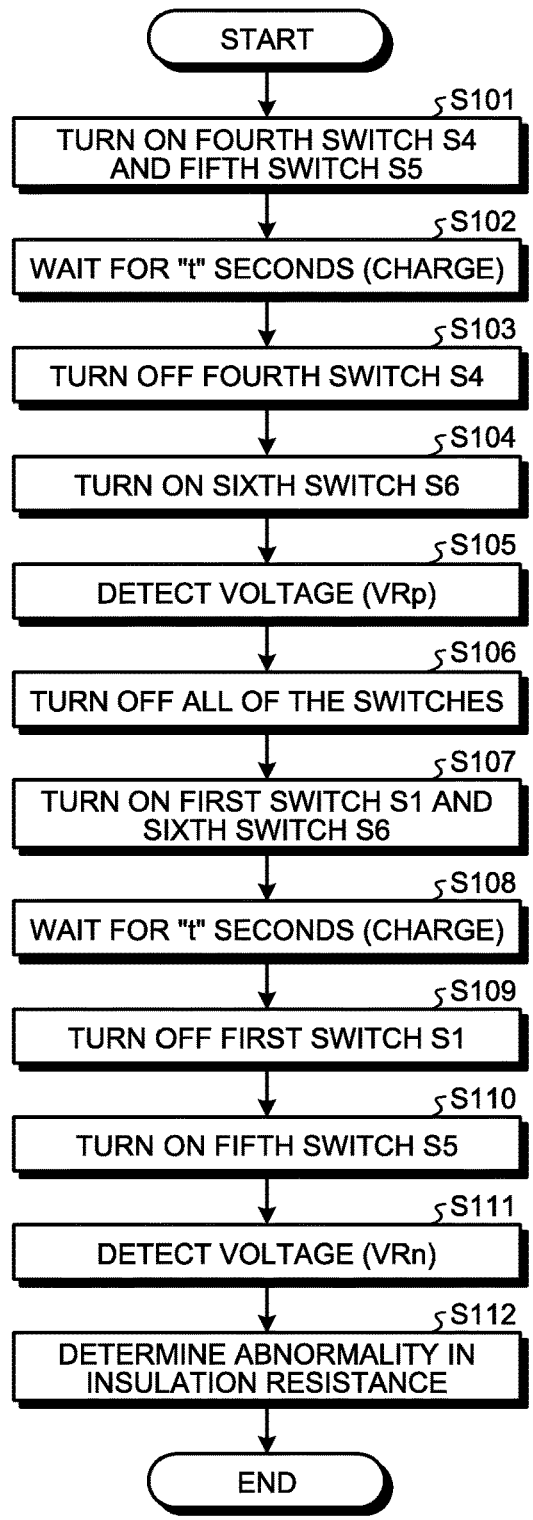
FIG. 10 is a flowchart illustrating a part of a processing procedure of a deterioration detecting process.

5. Specific Operations of Deterioration Detecting Process and Abnormal Part Specifying Process Next, a specific operation of the deterioration detecting process to be executed in the power-supply monitoring system 20 configured as described above will be explained with reference to FIG. 10, and a specifying process of an abnormal part to be executed in the vehicle controller 30 will be explained with reference to FIG. 11. FIG. 10 is a flowchart illustrating a part of a processing procedure of the deterioration detecting process. FIG. 11 is a flowchart illustrating a part of a processing procedure of the abnormal part specifying process.

As illustrated in FIG. 10, when starting a process, the power-supply monitoring device 23 turns ON the fourth switch S4 and the fifth switch S5 (S101), waits for "t" seconds, and charges the voltage on the first capacitor C1 (S102).

Subsequently, the power-supply monitoring device 23 turns OFF the fourth switch S4 (S103), and after turns ON the sixth switch S6 (S104), detects the voltage (VRp) (S105).

Subsequently, the power-supply monitoring device 23 turns OFF all of the switches (S106), and then turns ON the first switch S1 and the sixth switch S6 (S107), waits for "t" seconds, and then charges the voltage on the first capacitor C1 (S108).

Subsequently, the power-supply monitoring device 23 turns OFF the first switch S1 (S109), turns ON the fifth switch S5 (S110), and then detects the voltage (VRn) (S111). The power-supply monitoring device 23 determines an insulation abnormality by comparison between the voltage (VRp) and a threshold and comparison between the voltage (VRn) and a threshold (S112), and notifies the vehicle controller 30 of the determined result and the measured voltage.

As illustrated in FIG. 11, when generation of an insulation abnormality is notified of from the power-supply monitoring device 23 (S201), the vehicle controller 30 holds the last acquired voltage, in other words, the voltage (VRn) detected by the power-supply monitoring device 23 (S202).

Subsequently, when determining that an air conditioner is in operation (S203: Yes), the vehicle controller 30 transmits an OFF request to a gate of the air conditioner to disconnect the air conditioning part 42 (S204). When determining that the air conditioner is not in operation (S203: No), the vehicle controller 30 executes S205 without executing S204.

Subsequently, the vehicle controller 30 instructs the power-supply monitoring device 23 to start the insulation measurement so as to acquire the voltage (VRn) charged on the first capacitor C1 (S205), and computes the voltage difference from a holding value (VRn) (S206).

Herein, when the voltage difference is larger than the threshold (for example, equal to or less than 5 V) (S206: No), the vehicle controller 30 determines that an abnormal part is the air conditioning part 42 to terminate the process (S207).

On the other hand, when the voltage difference is equal to or less than the threshold (S206: Yes), the vehicle controller 30 drives the air conditioner (S208), and determines whether or not the boosted voltage is equal to or more than a reference value (S209).

When the boosted voltage (VH) exceeds the reference value (S209: Yes), the vehicle controller 30 instructs the power-supply monitoring device 23 to start the insulation measurement and acquires the voltage (VRn) charged in the first capacitor C1 (S210).

Herein, when the acquired voltage is within a certain range (S211: No), the vehicle controller 30 determines that an abnormal part is the motor 40 (S212), and terminates the process.

On the other hand, when the acquired voltage is not within a certain range (S211: Yes), the vehicle controller 30 waits until the ignition is turned OFF (IG_OFF) by a user operation (S213).

When the ignition is turned OFF (S213: Yes), the vehicle controller 30 transmits a request indicating turning OFF of the system main relay (SMR) to disconnect the PCU 41 (S214), and then instructs the power-supply monitoring device 23 to start the insulation measurement so as to acquire the voltage (VRn) charged on the first capacitor C1 (S215).

Subsequently, the vehicle controller 30 computes the voltage difference between the voltage (VRn) charged in the first capacitor C1 and the holding value (VRn), and when the voltage difference is equal to or less than the threshold (S216: Yes), detects an insulation abnormality of the assembled battery (S217). On the other hand, when the voltage difference is larger than the threshold (S216: No), the vehicle controller 30 detects an abnormality of the PCU (S218).

6. Time Chart of Deterioration Detecting Process and Abnormal Part Specifying Process Next, a time chart of the aforementioned process will be explained. FIG. 12 is a time chart of the deterioration detecting process and the abnormal part specifying process.

As illustrated in FIG. 12, first, the power-supply monitoring device 23 turns ON the fourth switch S4 and the fifth switch S5, waits for "t" seconds, and measures the voltage (VRp) charged on the capacitor. Subsequently, the power-supply monitoring device 23 sequentially turns OFF the fifth switch S5, the sixth switch S6, the second switch S2, and the third switch S3, then turns ON the first switch S1 and the sixth switch S6, waits for "t" seconds, and measures the voltage (VRn) charged on the capacitor.

Subsequently, the power-supply monitoring device 23 sequentially turns OFF the fifth switch S5, the sixth switch S6, the second switch S2, and the third switch S3, and then the power-supply monitoring device 20 and the vehicle controller 30 execute the deterioration detection of the insulation resistance and the abnormality detection of the air conditioning part 42.

Next, the power-supply monitoring device 23 turns ON the fourth switch S4 and the fifth switch S5, waits for "t" seconds, and measures the voltage (VRp) charged on the capacitor. Subsequently, the power-supply monitoring device 23 sequentially turns OFF the fifth switch S5, the sixth switch S6, the second switch S2, and the third switch S3, turns ON the first switch S1 and the sixth switch S6, waits for "t" seconds, and measures the voltage (VRn) charged on the capacitor.

Thus, the power-supply monitoring device 23 and the vehicle controller 30 repeatedly execute the measurement of the voltage (VRn), and determine an abnormality in each of the motor 40, the PCU 41, and the voltage detecting circuit 24.

7. Effects and Modification

As described above, because specifying of an abnormal part can be executed before the vehicle is stopped even when an insulation abnormality is detected during running of the vehicle, an abnormal part can be efficiently specified. High priority can be given to the abnormality determination of the air conditioning part 42 and the motor 40 during running. As a result, an abnormal part can be narrowed while keeping a situation where the insulation abnormality is generated, and thus the accuracy of specifying an abnormality generation part can be improved, so that it is possible to realize acceleration of an investigation into the cause and reduction of the recurrence probability.

The voltage VRn when each part is disconnected is measured to be able to narrow an abnormal part, and thus the abnormal part can be narrowed with the high accuracy. The use of only the existing voltage detecting circuit 24 enables detection of the insulation abnormality and specifying of the abnormal part to be executed without provision of another specific circuit, and thus cost reduction can be realized and increase in the circuit size can be also suppressed. The use of the preliminary prepared threshold enables an abnormality in the internal resistance of the motor 40 to be detected, and thus an abnormal part can be easily narrowed to be able to reduce a restoration time.

In the aforementioned embodiment, the positions and the numbers of the first capacitor C1, the second capacitor C2, the changeover switch S7, and the like are merely an example and are not limited thereto. In other words, the positions and the like of the first and second capacitors C1 and C2 may be any ones as long as whole of the electrostatic capacity can be changed between a charging path for detecting the voltage of the electric power source and a charging path for detecting deterioration in the insulation resistances Rp and Rn.

For example, in the voltage detecting circuit 24, a switch may be newly provided, which is serially connect to the first capacitor C1 and is parallel connected to the second capacitor C2 and the changeover switch S7. This newly-provided switch and the changeover switch S7 may be controlled to switch between a charging path including only the first capacitor C1 and a charging path including only the second capacitor C2.

In the voltage detecting circuit 24, for example, the second capacitor C2 and the changeover switch S7 may be serially connected to the first capacitor C1. Moreover, a switch may be newly provided, which is parallel connected to the first capacitor C1 and the changeover switch S7. This newly-provided switch and the changeover switch S7 may be controlled to switch between a charging path including the serially connected first and second capacitors C1 and C2; and a charging path including only the second capacitor C2.

In the aforementioned deterioration detection of insulation resistances Rp and Rn, each of the voltage VRp and the voltage VRn of the first capacitor C is compared with the threshold Va, however, is not limited thereto. In other words, for example, the voltage VRp and the voltage VRn may be added, and the added voltage may be compared with another preliminary set threshold to detect the deterioration in the insulation resistances Rp and Rn.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents. For example, in the aforementioned embodiment, the example in which the vehicle controller 30 specifies an abnormal part is explained, not limited thereto, the power-supply monitoring device 23 may execute the specifying.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A deterioration specifying device mounted on a vehicle, the device comprising:
   a capacitor that is connected to an insulated electric power source to execute charging/discharging;
   a voltage detector that detects a voltage of the capacitor when being charged through a charging path for detecting deterioration in a insulation resistance of the electric power source; and a specifying unit that specifies an abnormal part based on whether or not the voltage of the capacitor detected by the voltage detector is within a predetermined range, wherein the specifying unit determines: (1) during running of the vehicle, an abnormality of a motor, which is connected to the electric power source and the capacitor to be driven, based on whether or not the voltage of the capacitor is within a predetermined range, and (2) when the vehicle is stopped, an abnormality of a part mounted on the vehicle other than the motor, based on the voltage of the capacitor.

2. The deterioration specifying device according to claim 1, further comprising a deterioration detector that detects deterioration in the insulation resistance by comparison between a threshold and the voltage of the capacitor when being charged through the charging path for detecting deterioration in the insulation resistance of the electric power source, wherein the voltage detector forms the charging path to detect the voltage of the capacitor when the deterioration detector detects deterioration in the insulation resistance, and the specifying unit determines whether or not the motor is the abnormal part based on whether or not the voltage of the capacitor is within the predetermined range, and determines an abnormality of a part, other than the motor, mounted on the vehicle comparison between the voltage of the capacitor acquired by the deterioration detector and the voltage of the capacitor acquired by the voltage detector.

3. The deterioration specifying device according to claim 1, wherein, when the voltage of the capacitor is a voltage value that is equal to or less than a threshold, the specifying unit specifies an internal resistance included in the motor as the abnormal part.

4. The deterioration specifying device according to claim 2, wherein the voltage detector detects voltages of the capacitor when being charged through the charging path in a state where parts connected to the electric power source and the capacitor are sequentially disconnected, and the specifying unit computes difference voltages between the voltage of the capacitor acquired by the deterioration detector and the respective voltages of the capacitor when the parts are disconnected, and specifies, as the abnormal part, a part that is disconnected when the capacitor is charged with one of the voltages of the difference voltages that becomes equal to or more than the threshold.

5. A deterioration specifying method executed by a deterioration specifying device, mounted on a vehicle, including a capacitor that is connected to an insulated electric power source to execute charging/discharging, the method comprising:

detecting a voltage of the capacitor when being charged through a charging path for detecting deterioration in a insulation resistance of the electric power source; and specifying an abnormal part based on whether or not the voltage of the capacitor detected by the detecting is within a predetermined range, wherein the specifying includes:

determining, during running of the vehicle, an abnormality of a motor, which is connected to the electric power source and the capacitor to be driven, based on whether or not the voltage of the capacitor is within a predetermined range; and determining, when the vehicle is stopped, an abnormality of a part mounted on the vehicle other than the motor, based on the voltage of the capacitor.

* * * * *